United States Patent [19]
Attwood et al.

[11] Patent Number: 4,992,751
[45] Date of Patent: Feb. 12, 1991

[54] AUDIO AMPLIFIER WITH PHASE MODULATED PULSE WIDTH MODULATION

[75] Inventors: Brian E. Attwood, Horsham, United Kingdom; Larry E. Hand; Lee C. Santillano, both of Meridian, Miss.

[73] Assignee: Peavey Electronics Corporation, Meridian, Miss.

[21] Appl. No.: 422,518

[22] Filed: Oct. 17, 1989

[30] Foreign Application Priority Data

Mar. 4, 1989 [GB] United Kingdom ................. 8905002

[51] Int. Cl.$^5$ ............................................ H03F 3/393
[52] U.S. Cl. .......................................... 330/10; 363/26
[58] Field of Search ...................... 330/10, 207 A, 251; 323/283; 363/26.41

[56] References Cited

U.S. PATENT DOCUMENTS

| | | | |
|---|---|---|---|
| 4,178,556 | 12/1979 | Attwood | 330/10 |
| 4,182,992 | 1/1980 | Attwood | 330/251 |
| 4,479,175 | 10/1984 | Gille et al. | 363/41 |
| 4,509,101 | 4/1985 | Kenji | 361/79 |
| 4,600,891 | 7/1986 | Taylor, Jr. et al. | 330/10 |

OTHER PUBLICATIONS

Very High Fidelity Quartz Controlled PWM (Class D) Stereo Amplifiers for Consumer and Professional Use, Attwood, Brian E., Hamburg, Feb. 28-Mar. 3, 1978.
A 0.5 MHz Switching DC-AC Inverter Topology Provides Low EMI Environments for Critical Spacecraft Applications, Attwood, Brian E., Apr. 10-12, 1984.
Phase-Modulated AC Supply Exhibits High Efficiency, Zansky, Zoltan, Oct. 3, 1985.

Primary Examiner—James B. Mullins
Attorney, Agent, or Firm—Watson, Cole, Grindle & Watson

[57] ABSTRACT

In a digitally controlled amplifier circuit a dc power source is modulated by an oscillator signal for producing a reference square wave signal. A sawtooth signal, double the frequency of the reference signal and synchronized therewith, is compared with a variable input signal to be amplified. When the sawtooth exceeds the input signal a phase shifted version of the reference signal, shifted in phase in accord with the instantaneous amplitude of the variable signal is produced. A switching circuit logically governed by the reference and phase shifted signals produce a pulse width modulated output signal of a selected polarity. An output filter smooths the pulse width modulated output signal and steering diodes control the polarity of the switching circuit.

28 Claims, 4 Drawing Sheets

AUDIO AMPLIFIER WITH PHASE MODULATED PULSE WIDTH MODULATION

CROSS REFERENCE TO RELATED APPLICATIONS

This application claims priority to British application 8905002.5, filed Mar. 4, 1989. This application is also related in general to the subject matter of U.S. Pat. No. 4,600,891, issued 07/15/86, and its Reissue Patent RE , issued on reissue application Serial No. 211,217, filed 03/11/88, and which are directed to audio amplifiers using pulse width modulation (PWM) The subject matters of the aforesaid U.S. Pat. No. 4,600,891 and its Reissue are incorporated herein by reference thereto

BACKGROUND OF THE INVENTION

This invention relates to digital switching systems in general and, more particularly, to an improved arrangement for providing a novel dc-to-ac converter as modified to provide an improved audio amplifier. In one aspect, the invention is concerned with first and second switching means which are respectively associated with the primary and secondary sides of an isolation transformer, the first switching means being driven by a square wave reference signal of fixed phase and the second switching means being driven by the square wave reference signal but in phase modulated relation to this reference signal such that the logic combination of the reference signal and the phase shifted signal provide a pulse width modulated output signal under the control of input means for providing a variable signal which is to be amplified. The variable signal is the audio signal input.

A principal object of the present invention is to provide a digital audio amplifier which, in comparison with the prior art, has a lower component count, simpler manufacture, and further reduced weight and size, yet retains the performance required of a high-fidelity audio system.

The present invention is based on the use of phase modulated PWM rather than simple PWM.

For high-fidelity audio output, which is the principal field of the present invention, it is necessary to have low distortion, less than 0.25% THD and preferably less than 0.1% THD, and to achieve this the system should be capable of switching many times, preferably at least ten times, the highest audio frequency. It is also desirable that the amplifier be capable of stereo operation without an additional isolation transformer.

In one aspect of the invention, a simplified exemplary schematic block digital controlled switching circuit comprises a dc power source, first switching means connected to said power source and operable to provide a square wave output, second switching means connected to receive said square wave output, phase control means connected to control the switching of said second switching means at a phase angle relative to the square wave output which is a function of a control signal, and diode means for controlling the polarities of the outputs of said second switching means to provide a phase modulated pulse width modulation thereof.

In another aspect, the invention involves a digital controlled amplifier circuit, including a dc power source, first oscillator means for converting said dc power source to a reference signal which is a square wave, second oscillator means for producing a sawtooth signal which is synchronized with but at twice the frequency of said reference signal, input means for providing a variable signal which is to be amplified, comparator means receiving said variable signal and said sawtooth signal for producing a phase shifted square wave signal which is said reference signal shifted in phase in accord with the instantaneous amplitude of said variable signal, logic means receiving said reference signal and said phase shifted signal for producing a pulse width modulated output signal derived from the logic combination of said reference signal and said phase shifted signal, output filter means receiving said output signal for providing an amplified output of said means for providing a variable signal, and diode means for controlling the phase modulation of said pulse width modulated output signal.

DESCRIPTION OF PREFERRED EMBODIMENTS

Figure 1:
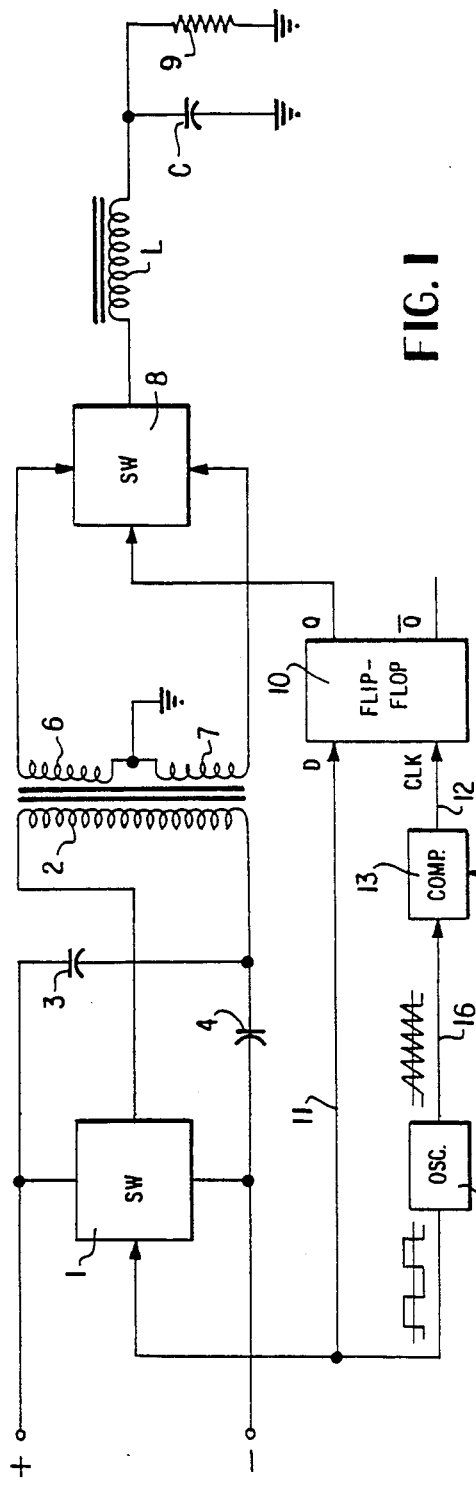
FIG. 1 is a circuit diagram of an amplifier embodying the invention in a basic form.

Referring to FIG. 1, a somewhat simplified schematic which illustrative of certain principles of the invention will be seen. As will be more apparent when the invention is described in relation to FIG. 3, it is necessary in practicing this invention that a dc power source be available.

Figure 2:
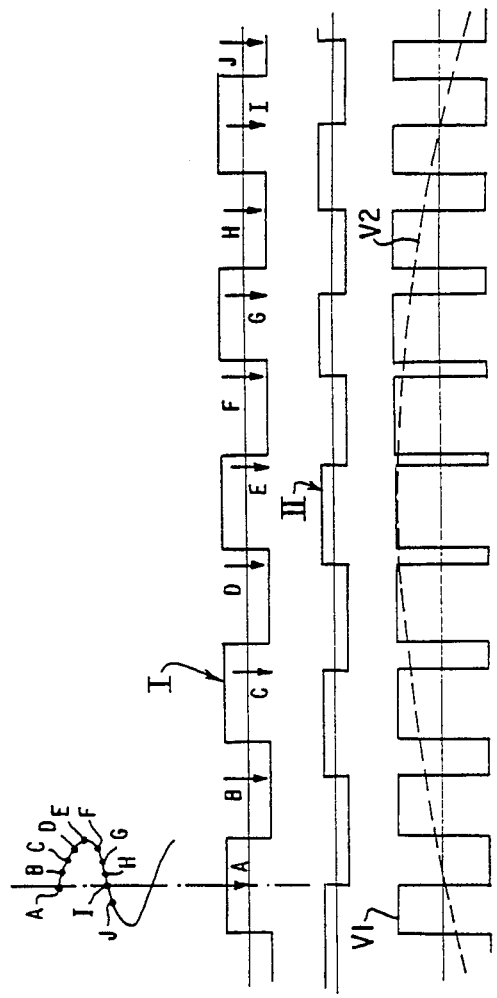
FIG. 2 shows waveforms illustrating phase modulation principles.

In FIG. 1, reference numeral symbolically illustrates a first switching means connected to the illustrated dc power source and it will be understood that this switching means is effective alternately to cause conduction through the primary 2 of an isolator transformer as through the capacitor 3, and then in the opposite direction across the primary, as through the capacitor 4. The net result is that a reference square wave, indicated as numeral I in FIG. 2, of equal mark/space ratio is imposed upon the transformer primary 2. This square wave is represented in FIG. 2 at numeral I and is the reference square wave of the system and is controlled by the square wave output as illustrated for the oscillator means 5 of FIG. 1. The secondaries 6 and 7 of the isolator transformer therefore have this reference square wave induced therein. However, the second switching means 8 alternately couples the induced square waves in phase modulated relationship through the output filter LC circuit and the load 9. The second switching means 8 is controlled by the logic means in the form of a D flip-flop 10 having as its D input the square wave reference signal from the oscillator means 5 as indicated at 11 and a clocking signal 12 from the comparator means 13. The comparator means receives a variable signal input from the means 14 and a sawtooth reference at 16 from the oscillator means 5. For ease of understanding, the waveforms of FIG. 2 are identified at the appropriate points in FIG. 1.

The means 8 contain circuitry involving toroid mechanism decoupling the circuitry from the secondaries 6 and 7 and serving to shift the phase of the reference signal induced across the secondaries 6 and 7 in the general fashion indicated in FIG. 2 so that the signal V2 which is applied to the input means 14 controls the phase shift. Normally, the signals I and II would be 90° out of phase as is indicated for the points A and I so that their logic combination would be a zero output. However, the instantaneous amplitude (A, B, C, etc.) of the variable signal input controls the phase shift to produce the pulse width modulated signal VI which is recovered at the junction of L and C as the amplified input signal as represented by V2.

Figure 3:
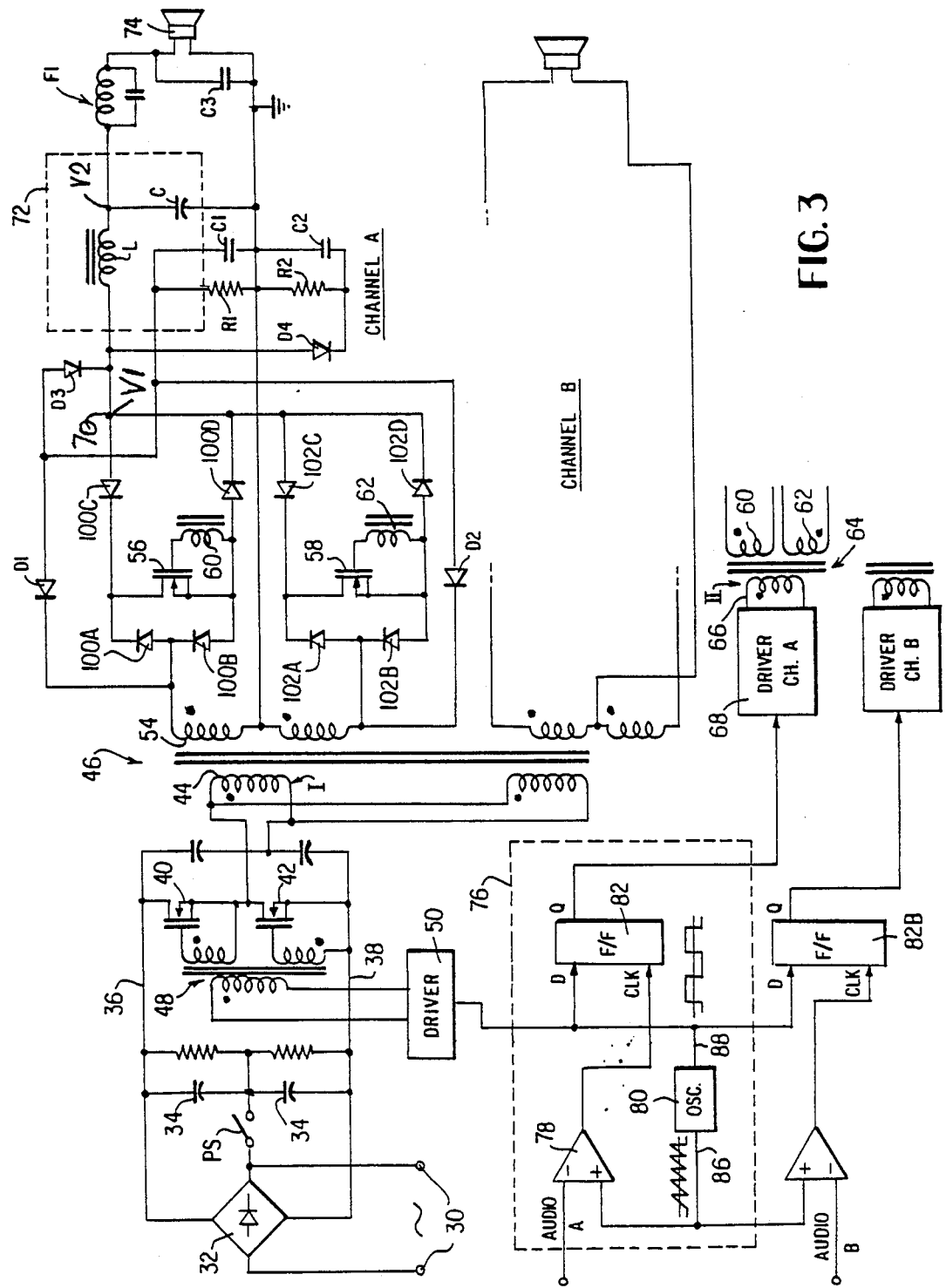
FIG. 3 illustrates a more detailed schematic diagram of the amplifier of FIG. 1.

The principles of phase modulated pulse width modulation is used in the audio amplifier circuitry of FIG. 3 wherein the ac input on the terminals 30 is rectified by the rectifier bridge 3 and smoothed by the capacitors 34 to provide dc across the lines 36, 38. The resistors in shunt across the capacitors 34 are needed to ensure equal voltage sharing.

The switch PS allows dual operation for 120/240 V systems, With the switch closed, the circuit operates as a voltage doubler providing approximately a 340 V dc bus across the Mosfets 40 and 42. With the switch open, for 240 V ac input, the dc bus will still be approximately 340 V dc, but not of course operating in the voltage doubler mode. The dc is switched by the Mosfets 40, 42 to provide the square wave reference signal which is of equal mark:space ratio to the primary 44 of the isolation transformer 46. The Mosfets 40, 42 are inductively coupled by a toroid 48 to a drive buffer 50 receiving the reference square wave from the oscillator means 80 which will be described in greater detail below. The amplifier of FIG. 3 is a stereo amplifier with the channels A and B on the secondary power side. For simplicity only the channel A is shown in full; it will be apparent that channel B is similar.

Referring then to channel A, the essential elements are a center-tapped secondary 54 of the isolation transformer 46, the secondary outputs being switched by the Mosfets 56, 58 at a phase angle which is controlled with respect to the reference square wave. The Mosfets 56, 58 are controlled via the respective secondaries 60, 62 of a toroid 64 whose primary 66 is driven via the buffer amplifier 68 by a circuit 76 to be described. The outputs of the Mosfets 56, 58 are combined at 70 and applied via the low-pass filter network 72 to a load in the form of the loudspeaker 74.

Typical Mosfets 40 and 42 would be type IRF350 and the Mosfets 56 and 58 would be type IRF240.

The low pass LC filter 72 is designed to have a cutoff frequency higher than the audio band of 20 K Hz and will provide good rejection at the switching frequency and will ideally limit the open loop attenuation to less than 1 dB at 20 K Hz. Typical values for L and C are 33 uH and 0.47 uF.

The tuned circuit F1 is placed after the low pass filter 72 to provide further rejection at the switching frequency.

It will be noted that each of the secondary side switching Mosfets 56, 58 is connected via pairs of oppositely-poled steering diodes 100A-D, 102A-D. The steering diodes are required since both switches must operate bi-directionally. It might be thought that a possible alternative arrangement, as sometimes used for synchronous rectifier operation is to use pairs of back-to-back Mosfets on each side. This reduces the number of diodes required since Mosfets do have an intrinsic internal diode, but at the expense of increasing the number of Mosfets. With steering diodes, the single Mosfet operates only in its forward enhanced mode and the external diodes have much quicker turn-off, 25ns or so.

It will be noted that further diodes D1, D2, D3, D4 are required in order to clamp voltage spikes appearing across the transformer 46 and the low-pass filter 72. In the system described, no bus rails are available to clamp any overshoots via the diodes on the secondary and it is therefore necessary to provide an artificial rail by means of the diodes D1-D4 and suitable RC combinations. The transformer 46 should also have low leakage inductance to minimize overshoots.

Due to the absence of any solid dc bus rails on the secondary side of the transformer 46, overshoots due to stored energy in the inductor L can produce breakdown problems in addition to causing non-linearities in the audio waveform. Therefore, it is essential to clamp these overshoots and the method adopted is to use RC combinations R1, C1 and R2, C2 and diode clamp. The operation is that diodes D1, D2 and D3 will charge the capacitor C1 negatively to provide a floating dc bus rail, the value of R1 being chosen to dissipate the overshoot energy while holding the bus rail substantially constant.

The positive overshoots are clamped by the diode D4. Further clamping may be effected by additional diodes from the junction between the secondary 54 and the steering diode 100A to the junction between the diode D4 and the R2, C2 junction and the junction between the secondary 54 and the steering diode 102B to the junction between the diode D4 and the R2, C2 junction. In this latter case, the diode polarity will be for the cathode to be connected to R2, C2. They may be small diodes since they only have to handle the overshoot energy, not the main current path. Typical values for R1 would be 2K ohms, for C1 would be 10 pf and the diodes could be type HER103.

The steering diodes 100A, 100B, 100C and 100D are necessary to allow the bi-directional current flow necessary for an audio system. On the positive-going cycle of the transformer secondary 54, current will flow via the diode 100A into the Mosfet 56 and then through the diode 100D into the averaging inductor L and thence to the load.

On the negative cycles, the current flow will be via the averaging inductor L, the diode 100C, the Mosfet 56 and the diode 100B and the transformer secondary 54. Thus, the current can only flow when the polarity of the transformer and the diode combinations are correct, and the Mosfet 56 will only operate in its forward enhanced mode, the long reverse recovery internal diode not being activated.

The same process is of course applicable to the Mosfet 58 and the steering diodes 102A, 102B, 102C and 102D.

The control circuit 76 comprises a comparator 78, an oscillator 80 and a register 82. The audio input for channel A is applied to the inverting input of the comparator 78, which may suitably be a type LM311 integrated circuit. The audio input may be processed in known manner before being applied to the comparator, suitably via an input operational amplifier, a digital delay, a Bessel filter and a feedback op amp, with feedback from the low-pass filter output. For best distortion performance it is desirable to employ special feedback techniques as more fully described in the above-referenced US patent and its Reissue.

The oscillator 80 produces the sawtooth waveform at 86, and a square wave of equal mark:space ratio at 88, the sawtooth being in phase with and at twice the frequency of the square wave. An integrated circuit suitable for this purpose is the US3825 high speed PWM controller by Unitrode Integrated Circuits of Merrimack, NH. The square wave output at 88 provides the reference signal to the primary driver 50.

For high quality audio applications, the PWM controller must have negligible deadtime between positive and negative excursions, certainly less than 100 ns. Most PWM controllers have deadtimes specifically built in to avoid crossover currents, the deadtime typically being 500 ns-1 us. A very short or zero deadtime is essential for audio application (a) to avoid any distortion degradation of the audio component, which increases substantially if any deadtime is present between upper and lower Mosfet switching, and (b) any excessive deadtime would reduce modulation index and thus output power capability. In practice, it is preferred to reduce deadtime to about 10 ns at the output Mosfets with a switching frequency at the low pass filter of 250-500 kHz. Utilizing a fast controller such as the UC3825 and combining this with suitable lead and lag circuits in the drive circuitry, it is feasible to ensure that the output Mosfets do indeed switch within 10 ns or so for optimum performance.

The ramp signal at 86 acts as an audio sampling signal at the comparator 78, the comparator output switching when the ramp signal reaches a value equal to the instantaneous audio amplitude. The comparator output is then applied to the register 82. Preferably, the register 82 is a D-type flip-flop (suitably a type 7474 integrated circuit), the reference square wave being applied to the D input and the comparator output to the Clock input. The Q output of the flip-flop 82 is thus correctly positioned in phase to drive the Mosfets 56, 58 in the manner described above.

Channel B is controlled in exactly the same manner. The same oscillator 80 is used to time both channels. A 7474 circuit can act as a register for both channels, although a separate register is shown at 82B in FIG. 1.

The low pass LC filter 72 is designed to have a cutoff frequency higher than the audio band of 20 K Hz and will provide good rejection at the switching frequency and will ideally limit the open loop attenuation to less than 1 dB at 20 K Hz. Typical values for L and C are 33 uH and 0.47 uF. The low-pass filtering technique used has been part of that fully described in the referenced patent 4,600,801 and its Reissue. The use of this prior technique however is not applicable to the high switching frequencies needed in the present invention (150-300 K Hz). This is because of the inherent limitations of the Mosfet internal diodes which are at least ten times slower than the Mosfet switching capability. Typical reverse recovery times of the internal diode range from 250 to 750 ns. The slow diodes also mean that a failure mode occurs particularly under spurious overload conditions. Under these conditions the switching waveforms are no longer synchronized and severe cross conduction can occur.

The drivers 50 and 68 may be type DS0026 integrated circuits or the like, or may be pnp/npn transistor complementary emitter followers.

There are a number of advantages to a phase modulated PWM audio amplifier. Firstly, the digital section of the amplifier (apart form the final input voltage to the low-pass filter) sees only square waves of approximately equal mark:space ratio. This allows the drive arrangements to be very simple, for example a small 60c toroid transformer driving switching devices in the form of Mosfets.

Secondly, the secondary power circuit no longer needs positive and negative dc bus rails. The power requirements are derived directly form the switching waveform from the isolation transformer, with no separate rectification for dc being required.

Further, for a given frequency of PWM signal into the filter, the power switching section can operate at half the frequency. For example, with 250 kHz power switching, the input to the low-pass filter becomes 500 kHz. This allows switching losses in the Mosfet section to be reduced, or alternatively the filter can be smaller for a given Mosfet loss.

The foregoing arrangement works well so long as the input amplitude does not exceed the amplitude of the sampling (ramp) signal. When this occurs, the modulator ceases to function, and the control signal to the secondary side Mosfets reduces to a dc level instead of a phase modulated signal. This problem could be met by limiting the amplitude of the input signal, but the resulting signal degradation may not be acceptable. Another approach is to add a pedestal to the top and bottom of the sampling signal; this has been found to be capable of satisfactory implementation, but involves more complexity.

Figure 4:
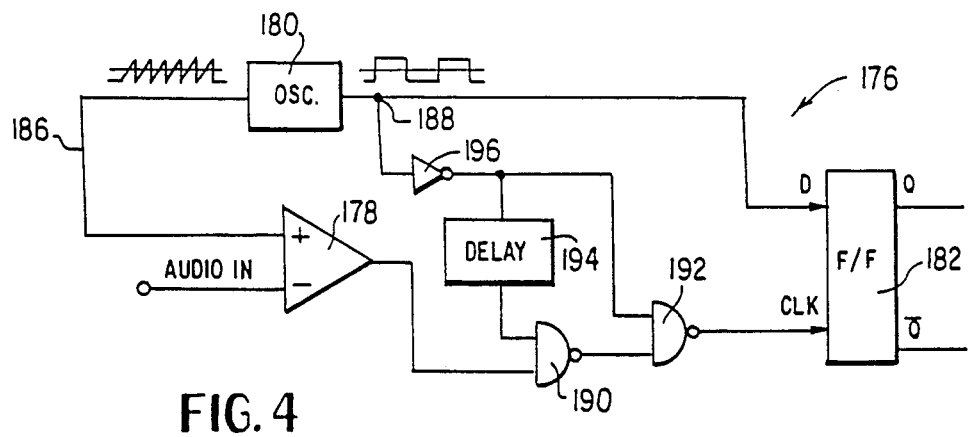
FIG. 4 illustrates a modification to another part of the amplifier of FIG. 1.

FIG. 4 shows a control circuit 176 which can be substituted for the control circuit 76 of FIG. 3 to meet the foregoing problem. The circuit of FIG. 4 provides a digital limiting by inserting a clock transition at the peaks of the sampling ramp waveform.

As before, the oscillator 180 supplies a reference square wave signal at 188 and a sawtooth or ramp sampling signal at 186. The sampling signal is applied to the non-inverting input of the comparator 178, and the audio input to the inverting input.

In normal operation, the output of the comparator 178 changes state in each cycle of the sampling waveform. This output passes via the gates 190, 192 to the Clock input of the D-type flip-flop 182, and the circuit operates as described above. When, however, the input exceeds the peak value of the sampling signal, the transitions at the output of the comparator 178 stop, which can happen in either of two states. If the output stops in the zero state, then the input is greater than the maximum positive peak of the sampling signal and the output phase must be limited to just less than 180 degrees. To accomplish this, the phase reference signal at 188 is gated through the gate 192 to provide a Clock input to the register 182 synchronized with the peak of the sampling signal. If the output of the comparator 178 stops at the logic 1 state, then the input is more negative than the negative peak of the sampling signal and the output phase must be limited to just greater than zero degrees. To accomplish this, the reference pulse at 188 is delayed by a delay circuit 194 and then applied to the gate 190. Since the output of the comparator 178 is held high, the delayed reference pulse is fed through the gate 190 to the gate 192. The reference pulse and the delayed reference pulse combine at the gate 192 to give an output in the form of a narrow pulse on the trailing edge of the reference pulse, this narrow pulse being applied to the Clock input of the register 182 in the correct position to hold the output phase at just greater than zero degrees.

A buffer 196 is included to correct the polarity of the reference pulse and to buffer the signal. This buffer may not be necessary in all application.

Figure 5:
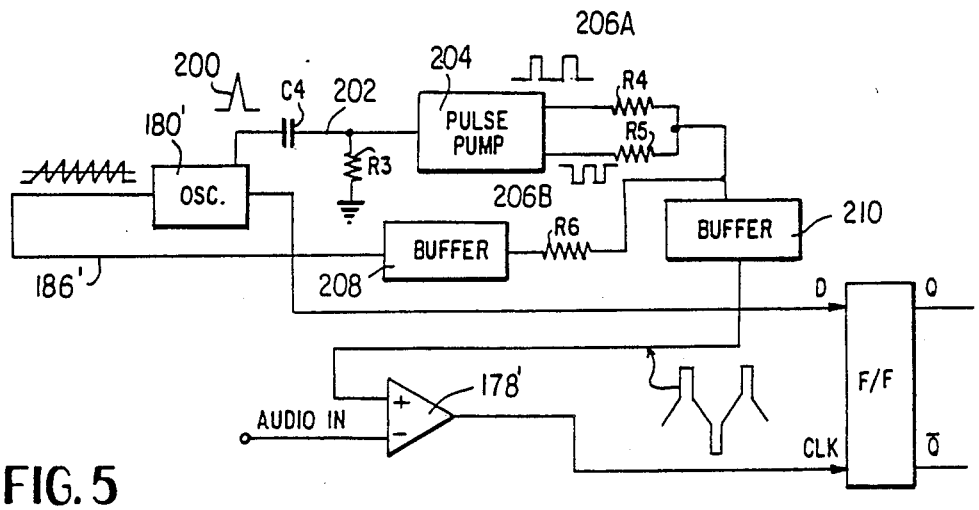
FIG. 5 illustrates an alternative modification to that of FIG. 4.

FIG. 5 shows an analog solution to the overdrive condition in which, as mentioned above, a pedestal is used at the top and bottom of the ramp waveform. A pulse 200 derived from the ramp retrace of the oscillator 180' is differentiated at 202 and applied to a high speed buffer inverter amplifier 204 to provide positive and negative going pulses 206A, 206B which are combined with the ramp signal 186', passing via the buffer 208, in an emitter follower circuit 210 to provide a combined signal 212 with pedestals to be applied to the non-inverting input of the comparator 178'. The positive and negative pedestals should preferably be about 5% of the total duty cycle so as to avoid undue limitation of the available modulation index. Also, the analog input signal applied to the comparator 178' should be limited to such a level that it will not exceed the pedestal height. To achieve this the pedestal amplitude should exceed the ramp amplitude by at least 2:1.

The digital approach of FIG. 4 for ramp clamping is preferred as being simpler and more precise.

It will be noted that each of the secondary side switching Mosfets 56, 58 is connected via pairs of oppositely-poled steering diodes 100A-D, 102A-D. The steering diodes are required since both switches must operate bi-directionally. It might be thought that a possible alternative arrangement, as sometimes used for synchronous rectifier operation is to use pairs of back-to-back Mosfets on each side. This reduces the number of diodes required since Mosfets do have an intrinsic internal diode, but at the expense of increasing the number of Mosfets. Under these conditions, the switching waveforms will no longer be synchronized and severe cross conduction may occur because of the turn-off time of the internal diodes, 250ns or longer. With steering diodes, the single Mosfet operates only in its forward enhanced mode and the external diodes have much quicker turn-off, 25ns or so.

Figure 6:
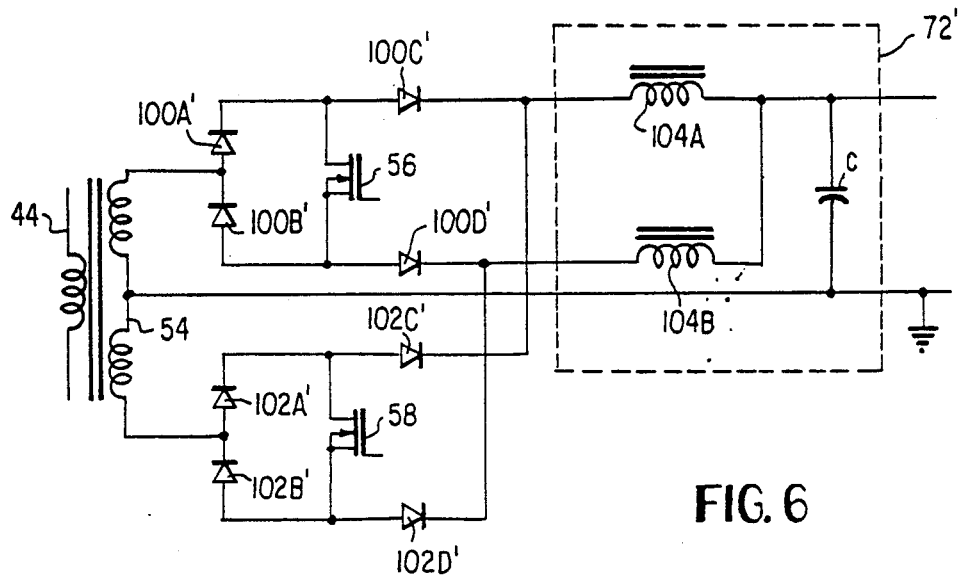
FIG. 6 illustrates an alternative modification to that of FIG. 5.

FIG. 6 shows a further modification in which the steering diodes 100D' and 102D' are separated from the steering diodes 100C' and 102C', the low-pass filter 72' then being split into the inductors 104A, 104B. This is an alternative approach to avoid the problem brought about by using a typical PWM IC. These ICs usually have a dead zone between switching transitions for safety reasons. However, in the application under consideration, the use of a dead zone will give rise to unwanted and dangerous voltage spikes mainly due to energy stored in the low pass filter. The use of a split filter 104A, 104B will overcome this problem since by restructuring the control circuit to actually allow some small cross conduction between Mosfets 56 and 58, excessive cross conduction currents will be limited to a safe value while still producing some measure of damping to voltage spikes.

As shown in FIG. 3, the invention makes is possible to drive two stereo channels from a single isolation transformer and primary reference oscillator, thus greatly reducing cost and size. To minimize cross-modulation each primary winding should be tightly coupled to its own secondary, with loose coupling to the other primary/secondary pair. In this way each secondary looks back directly at the very low source impedance of the primary Mosfets. Cross-modulation is also minimized by avoiding overshoots, as discussed above.

Figure 7:
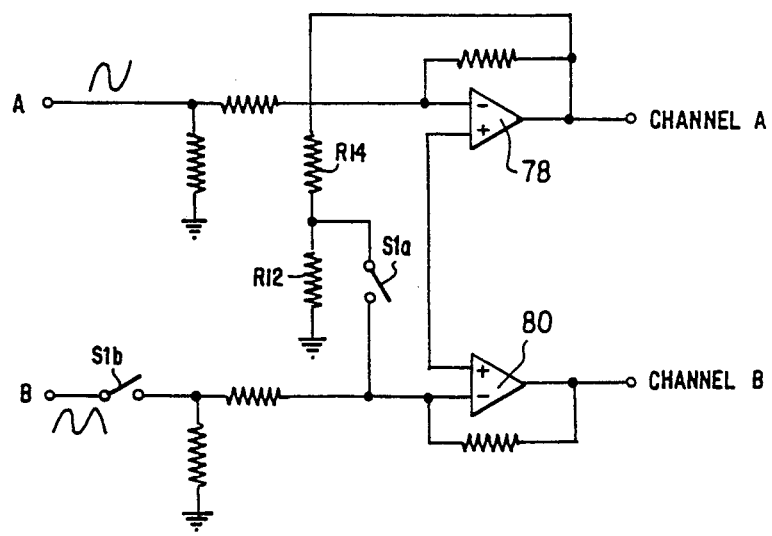
FIG. 7 is a view showing a modification of the audio input section.

In the modification as in FIG. 7, a switchable phase reversal circuit is provided in series with one of the analog input channels A or B. This allows the amplifier to be used (a) as a stereo amplifier in unbridged mode, (b) by utilizing the phase reversal switches S1a and S2b in FIG. 7 (when S1a is open, S1b is closed and vice versa) and applying an out of phase signal to input B of the system it may be used as a high power mono amplifier in bridge mode, or (c) as a high power inverter for 50/60/400 Hz output giving 120 Vac in unbridged mode or 240 Vac in bridge mode. When used in bridge mode the outputs are taken between the two output channels. The ratio of the values of the resistors R11 and R12 is such as to give unity gain compared to input A.

Figure 8:
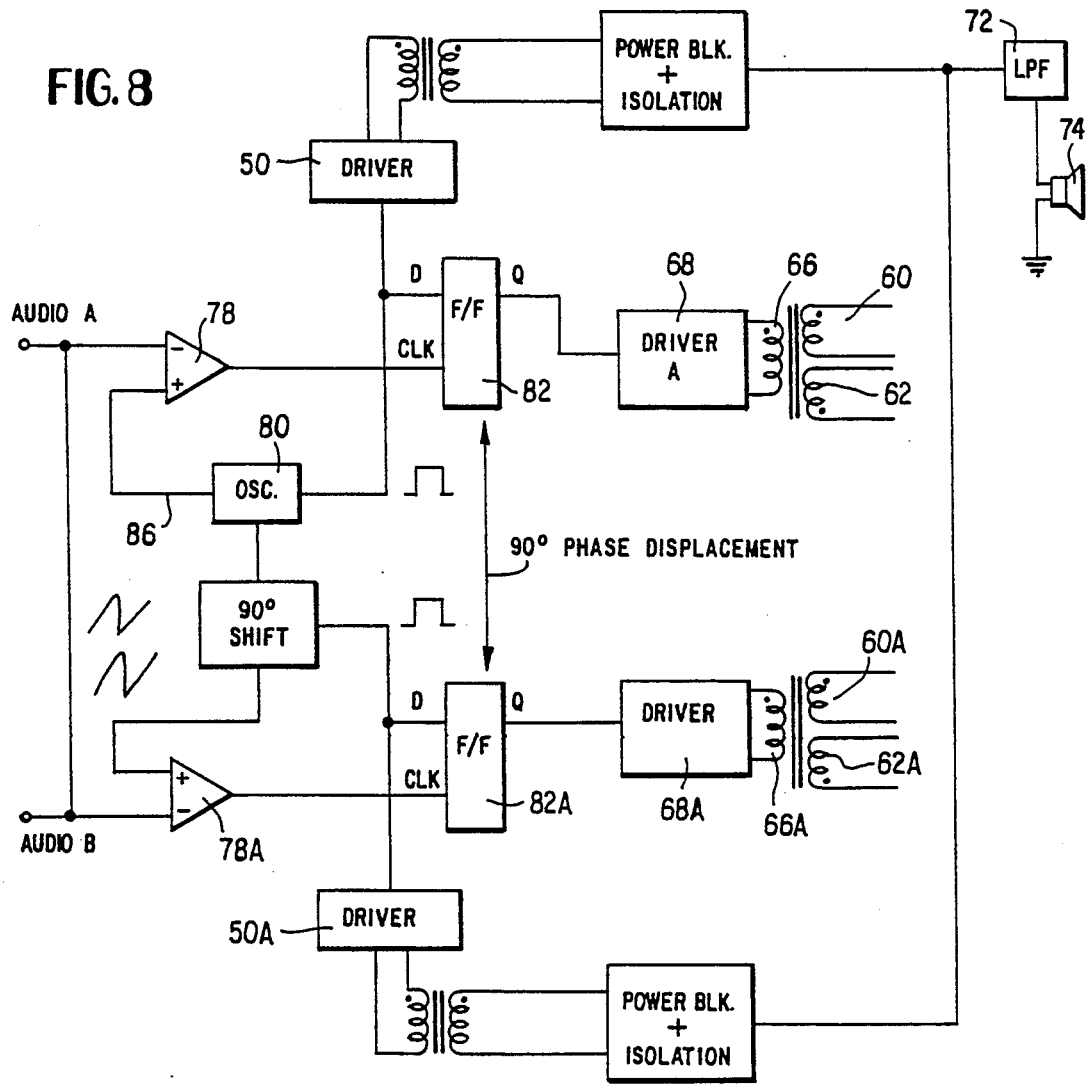
FIG. 8 is a modification using a 90° phase shift.

In FIG. 8, another modification is to duplicate the primary Mosfets 40 and 42 and the driver 50 therefor as the driver 50A, the isolation transformer 44 and secondary circuit or power block which feeds the low pass filter 72, with the duplicate circuitry being driven at 90 degrees phase displacement by the comparator 78A, register 82a and driver 50a, and feeding the same low pass filter 72. The effective switching frequency becomes four times the primary switching frequency at the low pass filter junction 70.

Other modifications may be made within the scope of the invention as defined in the following claims.

We claim:

1. In a digital controlled amplifier circuit, the combination of a dc power source, oscillator means for converting said dc power source to a reference signal which is a square wave and for producing a sawtooth signal which is synchronized with but at twice the frequency of said reference signal, input means for providing a variable signal which is to be amplified, comparator means receiving said variable signal and said sawtooth signal for producing a phase shifted square wave signal which is said reference signal shifted in phase in accord with the instantaneous amplitude of said variable signal, logic switching means receiving said reference signal and said phase shifted signal for producing a pulse width modulated output signal of a selected polarity derived from the logic combination of said reference signal and said phase shifted signal, output filter means receiving said output signal for providing an amplified output of said means for providing a variable signal, steering diode means for controlling the polarity of the logic switching means; and clamping means coupled to the logic switching means for removing overshoot spikes in the pulse width modulated output signal.

2. In a digital controlled power amplifier circuit as defined in claim 1, wherein said variable signal is an audio signal.

3. A digital controlled switching circuit comprising a dc power source, first switching means connected to said power source and operable to provide a square wave output, second switching means having a forward conduction mode connected to receive said square wave output, phase control means connected to control the switching of said second switching means at a phase angle relative to the square wave output which is a function of a control signal, and steering diode means for controlling the polarities of the outputs of said second switching means to operate in said forward conduction mode to provide a phase modulated pulse width modulation thereof.

4. A digital circuit in accordance with claim 3, in which said square wave output has an equal mark:space ratio, and said phase angle varies between 0 degrees and 180 degrees in accordance with the amplitude of the control signal whereby the output of said second switching means is a pulse-width-modulated representation of the control signal.

5. A digital circuit in accordance with claim 4, further including a low-pass filter interposed between the output of the second switching means and a load.

6. A digital circuit according to claim 5, which comprises an audio amplifier, said control signal being an input audio signal.

7. A digital circuit according to claim 6 including audio signal input means, in which the phase control means comprises oscillator means producing a square wave reference signal and a ramp signal synchronized therewith, means connecting the reference signal to the first switching means, a comparator receiving an input from said audio signal input means and the ramp signal to produce a comparator output signal transition whose phase relative to the ramp signal is a function of the audio signal amplitude, whereby the digital circuit functions as an audio amplifier.

8. A digital circuit according to claim 9 in which the comparator output signal is applied to a D-type flip-flop.

9. A digital circuit according to claim 8 wherein the comparator output being applied to the Clock input of the flip-flop and the square wave reference signal to the D input of the flipflop.

10. A digital circuit according to claim 9 in which the phase control means further includes limit means for clocking the flip-flop at 0 degrees or 180 degrees when the audio input is beyond the limits of the ramp signal.

11. A digital circuit according to claim 10 in which said limit means comprises a delay circuit having its input connected to receive the square wave reference signal, and gate means connected to receive the comparator output and the delayed and undelayed square wave reference signals and having an output connected to the flip-flop clock input, the gate means being arranged such that when the comparator output is continuously in one state the flip-flop is clocked by the undelayed square wave reference signal, and when the comparator output is continuously in the other state the flip-flop is clocked by a gated combination of the delayed and undelayed signals.

12. A digital circuit according to claim 3, in which the first switching means is connected to the second switching means via a transformer.

13. A digital audio amplifier comprising:
means providing a dc supply;
first and second Mosfets connected in series across said dc supply;
reference signal means applying a square wave reference of equal mark:space ratio to said first and second Mosfets to cause them to conduct alternatively;
an isolating transformer having a primary winding driven by said first and second Mosfets and having at least one pair of center-tapped secondary windings;
each of said secondary windings having respective Mosfet switching circuits connected across it;
steering diode means connected across said MOSFET switching circuits;
phase control means connected to control said Mosfet switching circuits;
the phase control means comprising an oscillator producing a ramp waveform in synchronization with said reference signal, and a comparator receiving as inputs said ramp waveform and an input audio signal to be amplified;
the output of the comparator controlling said Mosfet switching circuits to conduct at a phase angle with respect to said reference signal which is a function of the input audio signal amplitude; and
a low-pass filter connected across said secondary windings to give a filtered output which is substantially an amplified version of the audio input signal 14. A digital switching circuit comprising the combination of:
means providing a dc supply;
first switching means connected across said dc supply;
reference signal means for applying a square wave reference signal to said first switching means;
an isolating transformer having a primary winding driven by said first switching means and having a pair of center-tapped secondary windings;
second switching means connected across said secondary windings;
phase control means including input signal means for controlling said second switching means to conduct at a phase angle with respect to said reference signal which is a function of the amplitude of said input signal means;
low-pass filter means connected across said secondary windings to give a filtered output which is an amplification of the input signal;
said second switching means including current switching means connected across opposite sides of said secondary winding;
clamping diode means connecting opposite sides of said secondary winding to ground and including parallel RC combinations in the ground connection; and
steering diode means connecting said opposite sides of said current switching means to said low pass filter means.

15. The digital switching circuit as defined in claim 14 wherein said input signal means provides an audio signal input.

16. In a digital switching circuit, the combination of dc power source means and first switching means for producing a reference square wave signal across a secondary winding;
bi-directional current switching means connected across opposite sides of said second winding;
clamping diode means connecting opposite sides of said secondary winding to ground and including parallel RC combinations in the ground connection for creating artificial dc bus rails;
phase control means for controlling said current switching means, the phase control means comprising an oscillator producing a ramp waveform in synchronization with but at twice the frequency of said reference signal, comparator means receiving as inputs said ramp wave form and an input signal to be amplified for producing a register input signal when the ramp waveform exceeds the input signal to be amplified and a register means responsive to the register input signals for producing a control signal for the current switching means; and steering diode means connected to said opposite sides of said current switching means.

17. In a digital switching circuit as defined in claim 16 including means for adding pedestals to said ramp waveform.

18. In a digital switching circuit as defined in claim 16 including delay means for delaying said ramp waveform.

19. In a digital switching circuit as defined in claim 16 including low pass filter means comprising split inductors.

20. In a digital switching circuit as defined in claim 16 wherein the phase of the register input signal is shifted.

21. In a digital switching circuit as defined in claim 16 wherein the input signal is an audio signal and including means for selectively reversing the phase of the input signal.

22. In a digital switching circuit as defined in claim 16 wherein the input signal comprises a pair of stereo audio signals and said comparator means includes a stereo input channel for each audio signal.

23. In a digital switching circuit as defined in claim 22 including separate channel driver means controlled by said register means.

24. In a digital switching circuit as defined in claim 23 including toroid means driven by said driver means and controlling said current switching means.

25. In an audio amplifier, the combination of dc power source means and first switching means for producing a reference square wave signal across a secondary winding;

bi-directional current switching means connected across opposite sides of said secondary winding;

clamping diode means connecting opposite sides of said secondary winding to ground and including parallel RC combinations in the ground connection for creating artificial dc bus rails;

phase control means for controlling said current switching means, the phase control means comprising an oscillator producing a ramp waveform in synchronization with but at twice the frequency of said reference signal, comparator means receiving as inputs said ramp waveform and an input signal to be amplified and a register means;

steering diode means connected to said opposite sides of said current switching means; and said current switching means comprising Mosfets.

26. In an audio amplifier as defined in claim 25 wherein said input signal comprises a pair of audio inputs and said comparator means includes corresponding stereo input channels.

27. In an audio amplifier as defined in claim 26 including separate channel driver means controlled by said register means.

28. In an audio amplifier as defined in claim 27 including toroid means driven by said driver means and controlling said current switching means.

* * * * *